United States Patent [19]
Chan et al.

[11] Patent Number: 5,801,396
[45] Date of Patent: *Sep. 1, 1998

[54] INVERTED FIELD-EFFECT DEVICE WITH POLYCRYSTALLINE SILICON/GERMANIUM CHANNEL

[75] Inventors: Tsiu Chiu Chan, Carrollton; Yu-Pin Han, Dallas; Elmer H. Guritz, Roanoke, all of Tex.; Richard A. Blanchard, Los Altos, Calif.

[73] Assignee: STMicroelectronics, Inc., Carrollton, Tex.

[*] Notice: The term of this patent shall not extend beyond the expiration date of Pat. No. 5,770,892.

[21] Appl. No.: 488,398

[22] Filed: Jun. 7, 1995

Related U.S. Application Data

[63] Continuation-in-part of Ser. No. 460,494, Jun. 2, 1995, which is a continuation of Ser. No. 218,700, Mar. 28, 1994, abandoned, which is a continuation of Ser. No. 798,615, Nov. 26, 1991, abandoned, which is a division of Ser. No. 531,014, May 31, 1990, Pat. No. 5,135,888, which is a continuation-in-part of Ser. No. 298,530, Jan. 18, 1989, Pat. No. 5,196,233.

[51] Int. Cl.⁶ ............................................. H01L 29/04
[52] U.S. Cl. ........................ 257/65; 257/369; 257/903
[58] Field of Search ........................ 257/65, 350, 368, 257/369, 616, 903

[56] References Cited

U.S. PATENT DOCUMENTS

| | | | |
|---|---|---|---|
| 4,072,974 | 2/1978 | Ipri | 357/23 |
| 4,118,642 | 10/1978 | Richardson | 257/393 |
| 4,389,481 | 6/1983 | Poleshuk et al. | 430/319 |
| 4,467,518 | 8/1984 | Bansal et al. | 29/571 |
| 4,476,475 | 10/1984 | Naem et al. | 357/23.7 |
| 4,502,202 | 3/1985 | Malhi | 29/571 |
| 4,545,112 | 10/1985 | Holmberg et al. | 29/577 |
| 4,554,572 | 11/1985 | Chatterjee | 357/42 |
| 4,556,895 | 12/1985 | Ohata | 357/23.7 |
| 4,581,623 | 4/1986 | Wang | 357/23.7 |
| 4,597,160 | 7/1986 | Ipri | 29/571 |

(List continued on next page.)

FOREIGN PATENT DOCUMENTS

| | | |
|---|---|---|
| 0104616 | 4/1984 | European Pat. Off. . |
| 0392540 | 10/1990 | European Pat. Off. . |
| 2503864 | 8/1976 | Germany . |
| 56-26467 | 3/1981 | Japan . |
| 56-83075 | 7/1981 | Japan . |
| 2191893 | 12/1987 | United Kingdom . |

OTHER PUBLICATIONS

Colinge, et al., "A High Density CMOS Inverter with Stacked Transistors," IEEE Electron Device Letters, vol. EDL-2, No. 10, p. 250 (1981), Oct. 1981.

Kamins, et al., "Hydrogenation of Transistors Fabricated in Polycrystalline–Silicon Films," IEEE Electron Device Letters, vol. EDL-1, No. 8, p. 159 (1980), Aug. 1980.

Malhi, et al., "Characteristics and Three-Dimensional Integration of MOSFET's in Small-Grain LPCVD Polycrystalline Silicon," IEEE Journal of Solid-State Circuits, vol. SC-20, No. 1, p. 178 (1985), and IEEE Transactions on Electron Devices, vol. ED-32, No. 2, p. 258 (1985), Feb. 1985.

(List continued on next page.)

*Primary Examiner*—Mark V. Prenty
*Attorney, Agent, or Firm*—Richard A. Bachand; Theodore E. Galanthay; Lisa K. Jorgenson

[57] ABSTRACT

A CMOS device architecture which includes substrate-gated inverted PMOS transistors, as well as bulk NMOS. The inverted-PMOS channels are formed in a different layer from the NMOS gates, and these layers may even have different compositions. Moreover, the NMOS and inverted-PMOS devices have different gate oxide layers, so the thicknesses can be independently optimized. The drain underlap of the inverted device is defined by a patterning step, so it can be increased for high-voltage operation if desired.

22 Claims, 5 Drawing Sheets

U.S. PATENT DOCUMENTS

| | | | |
|---|---|---|---|
| 4,603,468 | 8/1986 | Lam | 29/571 |
| 4,628,589 | 12/1986 | Sundaresan | 29/571 |
| 4,633,438 | 12/1986 | Kume et al. | 365/51 |
| 4,654,121 | 3/1987 | Miller et al. | 156/653 |
| 4,772,927 | 9/1988 | Saito et al. | 357/23.7 |
| 4,789,644 | 12/1988 | Meda | 437/41 |
| 4,797,804 | 1/1989 | Rockett, Jr. | 365/154 |
| 4,814,850 | 3/1989 | Malhi | 357/42 |
| 4,890,148 | 12/1989 | Ikeda et al. | 357/45 |
| 4,920,391 | 4/1990 | Uchida | 357/23.6 |
| 4,980,732 | 12/1990 | Okazawa | 357/23.5 |
| 4,987,092 | 1/1991 | Kobayashi et al. | 437/57 |
| 5,001,540 | 3/1991 | Ishihara | 357/23.4 |
| 5,057,898 | 10/1991 | Adan et al. | 357/59 |
| 5,135,888 | 8/1992 | Chan et al. | 437/186 |
| 5,157,474 | 10/1992 | Ochii | 357/41 |
| 5,162,892 | 11/1992 | Hayashi et al. | 257/65 |
| 5,173,754 | 12/1992 | Manning | 257/69 |
| 5,248,630 | 9/1993 | Serikawa et al. | 437/101 |
| 5,262,655 | 11/1993 | Ashida | 257/66 |
| 5,283,455 | 2/1994 | Inoue et al. | 257/329 |
| 5,298,782 | 3/1994 | Sundaresan | 257/393 |
| 5,349,206 | 9/1994 | Kimura | 257/69 |

OTHER PUBLICATIONS

Lim, et al., "Threshold Voltage of Thin–Film Silicon–on–Insulator (SOI) MOSFET's," IEEE Transactions on Electron Devices, vol. ED–30, No. 10, p. 1244 (1983), Oct. 1983.

Yamanaka, et al., "A 25 um$^2$, New Poly–Si PMOS Load (PPL) SRAM Cell Having Excellent Soft Error Immunity," IEDM, p. 48 (1988), Dec. 1988.

Weimer, "The TFT—A New Thin–Film Transistor," Proceedings of the IRE, p. 1462 (1962), Jun. 1962.

Unagami, et al., "High–Voltage Polycrystalline–Silicon TFT for Addressing Electroluminescent Devices," Proceedings of the SID, vol. 25/2, p. 117 (1984), Dec. 1984.

Malhi, et al., "p–Channel MOSFET's in LPCVD Polysilicon," IEEE Electron Device Letters, vol. EDL–4, No. 10, p. 369 (1983), Oct. 1983.

Shiehijo, et al., "Polysilicon Transistors in VLSI MOS Memories," IEDM, p. 228 (1984), Dec. 1984.

Sundaresan, et al., "A Fully Self–Aligned Stacked CMOS 64K SRAM," IEDM, p. 871 (1984), Dec. 1984.

Colinge, et al., "Stacked Transistors CMOS (ST–MOS), an NMOS Technology Modified to CMOS," IEEE Transactions on Electron Devices, vol. ED–29, No. 4, p. 585 (1982), Apr. 1982.

Gibbons, et al., "One–Gate Wide CMOS Inverter on Laser–Recrystallized Polysilicon," IEEE Electron Device Letters, vol. EDL–1, No. 6, p. 117 (1980), Jun. 1980.

Seki, et al., "Laser–Recrystallized Polysilicon Thin–Film Transistors with Low Leakage Current and High Switching Ratio," IEEE Electron Device Letters, vol. EDL–8, No. 9, p. 425 (1987).

Garnache, "Complimentary FET Memory Cell," IBM Technical Disclosure Bulletin, vol. 18, No. 12, p. 3947 (1976), May 1976.

Verdonckt–Vandebroek, et al., "SiGe–Channel Heterojunction p–MOSFET's," IEEE Transactions on Electron Devices, vol. 41, No. 1 (1994), Jan. 1994.

King, "Electrical Properties of Heavily Doped Polycrystalline Silicon–Germanium Films," IEEE Transactions on Electron Devices, vol. 41, No. 2 (1994), Feb. 1994.

King, et al., "Deposition and Properties of Low–Pressure Chemical–Vapor Deposited Polycrystalline Silicon–Germanium Films," J. Electrochem Soc., vol. 141, No. 8 (1994), Aug. 1994.

Kesan, et al., "High Perfomance 0.25 p, p–MOSFETs with Silicon–Germanium Channels for 300K and 77K Operations," IEDM, p. 25 (1991), Dec. 1991.

Caymax, et al., "Low Temperature Selective Growth of Epitaxial Si and $Si_{1-x}Ge_x$ Layers from $SiH_4$ and $GeH_4$ in an ultrahigh vacuum, very low pressure chemical vapour deposition reactor: kinetics and possibilities," Thin Solid Films, p. 324 (1994), Dec. 1994.

King, "A Low–Temperature (< or + 550 C) Silicon–Germanium MOS Thin–Film Transistor Technology for Large–Area Electronics," IEDM, p. 567 (1991), Dec. 1991.

Hsieh, "Ambipolar Performances of Novel Amorphous Silicon–Germanium Alloy Thin–Film Transistors," Jpn. J. Appl. Phys., vol. 32 p. L1043, (1993), Aug. 1993.

Noguchi, et al., "Resistivity Study of P_, B_, and $BF_2$–Implanted Polycrystalline $S_{i1-x}GE_x$ Films with Subsequent Annealing," Jpn J. Appl. Phys., vol. 33, p. L1748 (1994), Dec. 1994.

Lin, et al., "Fabrication of p–channel polycrystalline $Si_{1-x}GE_x$ thin–film transistors by ultrahigh chemical vapor deposition," Appl. Phyus. Lett. p. 1700 (1994), Sep. 1994.

Lin et al., "Effects of $SiH_4$, $GeH_4$, and $B_2H_6$ on the Nucleation and Deposition of Polycrystalline $Si_{1-x}Ge_x$ Films," J. Electrochem Soc., vol. 141, No. 9 (1994), Sep. 1994.

King, et al., "Polycrystalline Silicon–Germanium Thin–Film Transistors," IEEE Transactions on Electron Devices, vol. 41, No. 9 (1994), Sep. 1994.

Selvakumar, "SiGe–Channel n–MOSFET by Germanium Implantation," IEEE Electron Device Letters, vol. 12, No. 8 (1991), Aug. 1991.

Prokes, Formation of epitaxial $Si_{1-x}Ge_x$ films produced by wet oxidation of amropheous Sige layers deposited on Si(100). Appl. Phys. Lett. 53, p. 2483 (1988), Dec. 1988.

Humlicek, et al., "Optical spectra of $Si_xGe_{1-x}$ alloys," J. Appl. Phys. 65, p. 2827 (1989), Apr. 1989.

King, et al., "PMOS Transistors in LPCVD Polycrystalline Silicon–Germanium Films," IEEE Electron Device Letters, vol. 12, No. 11, p. 584 (1991), Nov. 1991.

Verdonckt–Vandebroek, et al., "High–Mobility Modulation–Doped Graded SiGe–Channel p–MOSFET's," IEEE Electron Device Letters, vol. 12, No. 8 (1991), Aug. 1991.

Verdonckt–Vandebroek, et al., "Design Issues for SiGe Heterojunction FETs," IEEE, p. 425 (1991), Dec. 1991.

Johnson, et al., "Selective Chemical Etching of Polycrystalline SiGe Alloys with Respect to Si and $S_iO_2$," Journal of Electronic Materials, vol. 21, No. 8 (1992), Dec. 1992.

Hu, "A Parametric Study of Power Mosfets," IEEE p. 385 (1979), Dec. 1979.

Hamakawa, "Recent Advances in Amorphous Silicon Solar Cells and Their technologies," Journal of Non–Crystalline Solids, p. 1265 (1983), Dec. 1983.

Taur, et al., "0.1 pm CMOS and Beyond," VLSITSA (1993), Dec. 1993.

Tsutsu, "Oxidation of polycrystalline–SiGe alloys," Appl. Phys. Lett. 64, p. 297 (1994), Jan. 1994.

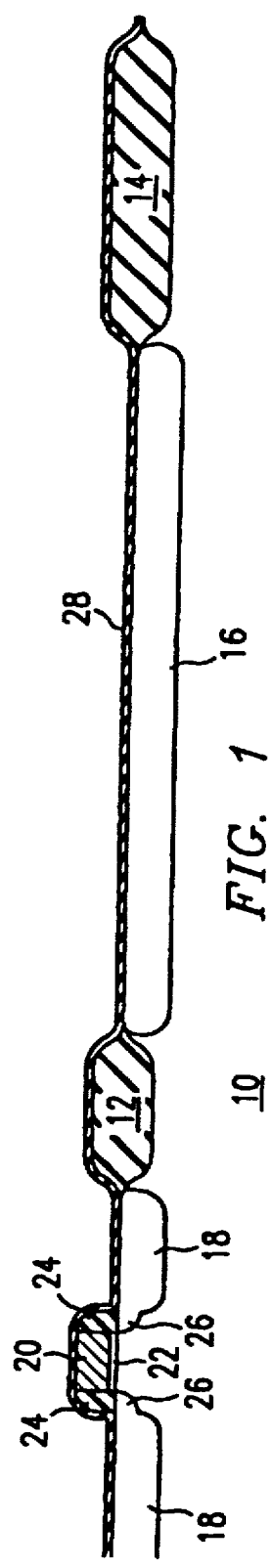
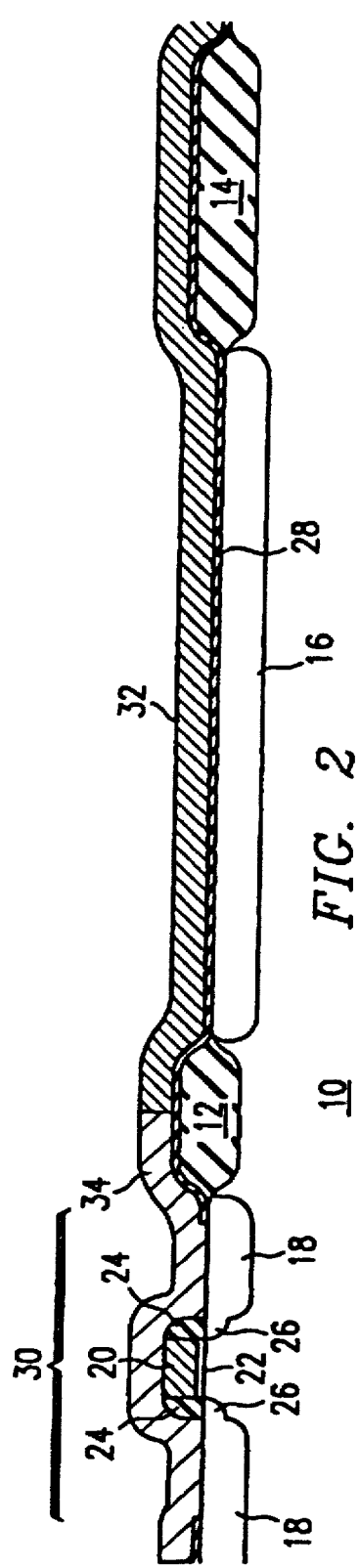
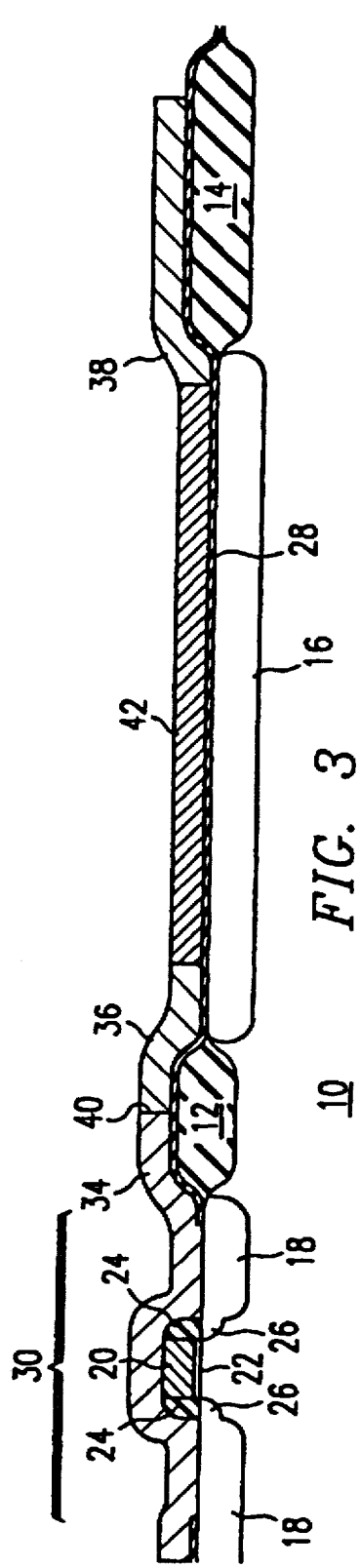

INVERTED FIELD-EFFECT DEVICE WITH POLYCRYSTALLINE SILICON/GERMANIUM CHANNEL

CROSS-REFERENCE TO RELATED APPLICATION

This application is a continuation-in-part of U.S. patent application 08/460,494, filed Jun. 2, 1995, which is a continuation of 08/218,700 filed Mar. 28, 1994, (now abandoned) which is a continuation of 07/798,615 filed Nov. 26, 1991 (now abandoned), which is a continuation of 07/531,014, filed May 31, 1990 (now issued as U.S. Pat. No. 5,135,888), which is a continuation-in-part of 07/298,530 filed Jan. 18, 1989 (now issued as U.S. Pat. No. 5,196,233), which is hereby incorporated by reference.

BACKGROUND AND SUMMARY OF THE INVENTION

The present invention relates generally to integrated circuits which include a field effect device having a polycrystalline channel.

Background: 4T and 6T SRAM Cells

Static random access memories (SRAM) are increasingly used in the electronics industry due to their combination of speed, low power, and lack of requirement for refresh. Static RAM cells are also used in the midst of logic circuitry. An SRAM cell is built around a cross-coupled latch, accessed by two pass transistors for a standard SRAM cell. (Four pass transistors are used to access the cell for 2-port memory devices.)

The standard CMOS SRAM cell uses cross-coupled CMOS inverters, having two N-channel and two P-channel transistors each. Such cells are known as "6T" cells, since (with the two pass transistors) they have six transistors per cell.

Alternatively, to conserve physical layout space and/or avoid process complexity, the latch can be constructed as an NMOS latch. In this case the P-channel transistors are replaced by high-impedance passive loads, e.g. by a polycrystalline silicon resistor or back-to-back polycrystalline silicon diodes. An example of the latter is described in U.S. patent application 07/298,530, filed Jan. 18, 1989 and now issued as U.S. Pat. No. 5,196,233, which is hereby incorporated by reference. Such loads normally have a very high effective resistance (gigaohms to teraohms) in order to reduce power consumption by the cell. Such cells are referred to as "4T" cells.

Use of P-channel transistors rather than passive elements in the cell latch results in a cell having better electrical characteristics. The sensing operation can be designed for greater speed, since the P-channel transistor in the ON state can provide a higher drive current than high resistance devices. Also, use of P-channel transistors gives higher immunity to soft errors, such as those caused by alpha particle impacts and noise. The primary disadvantage of SRAM cells incorporating P-channel load transistors is that the layout area for each cell is significantly larger than those using resistive loads. This reduces device density and increases chip costs.

Background: Silicon/Germanium Thin Film Transistors

Germanium is a semiconductor material which has a slightly narrower bandgap, and more nearly equal electron and hole mobilities, than silicon. Much of the earlier transistor work used germanium, but silicon completely replaced germanium in the mainstream of semiconductor development in the 1960s. Thereafter there was little work on germanium materials until around 1990, when a significant amount of effort began to be devoted to development of fabrication processes using silicon/germanium ("SiGe") alloys.

Germanium is electrically neutral in silicon, and germanium and silicon are mutually soluble. One important attraction of silicon/germanium alloys is that they permit heterojunction devices to be obtained with conventional silicon processing. However, another attraction is that they provide advantages in thin-film transistors, i.e. transistors with polycrystalline or amorphous channels. See King et al., "PMOS transistors in LPCVD polycrystalline silicon-germanium films," 12 IEEE ELECTRON DEVICE LETTERS 584 (1991); King et al., "Polycrystalline silicon-germanium thin-film transistors," 41 IEEE TRANS'NS ELECTRON DEVICES 1581 (1994); King and Saraswat, "A low-temperature ($\leq 500$ degrees C.) silicon-germanium MOS thin-film transistor technology for large-area electronics," 1991 IEDM TECHNICAL DIGEST 567–70; Taur et al., "0.1 μm CMOS and beyond," 1993 INTERNATIONAL SYMPOSIUM ON VLSI TECHNOLOGY 1; Yan et al., "Amorphous silicon, germanium, and silicon-germanium alloy thin-film transistor performance and evaluation," 50 APPLIED PHYSICS LETTERS 1367 (1987); all of which are hereby incorporated by reference. It has also been reported that SiGe polycrystalline layers can provide better sheet resistance that SiGe polycrystalline layers. See Noguchi et al., "Resistivity study of P-, B-, and $BF_2$-implanted polycrystalline $Si_{1-x}Ge_x$ films with subsequent annealing," 33 JAPANESE J. APPLIED PHYSICS, PART 2 (LETTERS) at L1748 (1994), which is hereby incorporated by reference.

Innovative Disclosure

One class of embodiments disclosed in the present application provides a CMOS SRAM cell whose latch includes two NMOS transistors and two PMOS transistors. The NMOS transistors are conventional (with the gates formed in a first polycrystalline conductor layer, which is polysilicon). However, the PMOS transistors are thin film transistors, and have their channels formed in a second polycrystalline layer, which can be polysilicon or can be formed from a silicon/germanium alloy. This layer provides routing from the power supply to the two data storage nodes of the latch. A portion of this polycrystalline signal line provides the channel of a field effect device: this channel is capacitively coupled, through a thin gate dielectric, to a diffusion in the substrate which functions as the control gate for the field effect device. These two thin film transistors are cross-coupled with two conventional NMOS drivers to provide the latch of a six-transistor CMOS SRAM cell. These two thin film transistors, in the presently preferred embodiment, are enhancement-mode PMOS transistors (P+/N−/P+).

Preferably an additional diode is introduced in series with the PMOS transistor.

It would be desirable to provide an SRAM cell which combined the advantages of P-channel loads with the cell layout area requirements of resistive load cells. It would be further desirable to provide a field effect device load, suitable for use with an SRAM cell, which provides increased current drive over resistive loads, and which provides a high OFF resistance.

It is therefore an object of the present invention to provide a load for CMOS SRAM cells which utilizes P-channel transistors.

It is a further object to provide such a load device which can be fabricated in the same amount of chip area as resistive load cells.

It is another object of the present invention to provide a field effect device having a conductive channel in a polycrystalline signal line.

It is yet another object of the present invention to provide such a field effect device which is suitable for use as a CMOS SRAM cell load.

The parent application describes an SRAM structure which includes an "ISTFET" (Inverted Substrate-gated Thin-film FET). The present application also describes various device modifications and integrated device structures incorporating the ISTFET.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 1-4 illustrate fabrication of a polycrystalline silicon field effect device as described in the parent application.

DETAILED DESCRIPTION OF THE PREFERRED EMBODIMENTS

The numerous innovative teachings of the present application will be described with particular reference to sample embodiments (by way of example, and not of limitation), in which:

The first embodiment described is a static memory cell using inverted transistors with polycrystalline silicon channels. The second embodiment described is a memory or logic component using inverted transistors with polycrystalline silicon/germanium channels. The third embodiment described is a high-voltage device structure, with various modifications.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

First Embodiment: Inverted Transistor with Polysilicon Channel

Referring to FIG. 1, a cross-section of a portion of a CMOS SRAM cell is shown as being fabricated in a P-type substrate 10. Field oxide regions 12, 14 separate active regions of the device. Active region 16 is located between field oxide regions 12, 14, and forms a common source/drain region for 2 field effect transistors (not shown).

Figure 5:
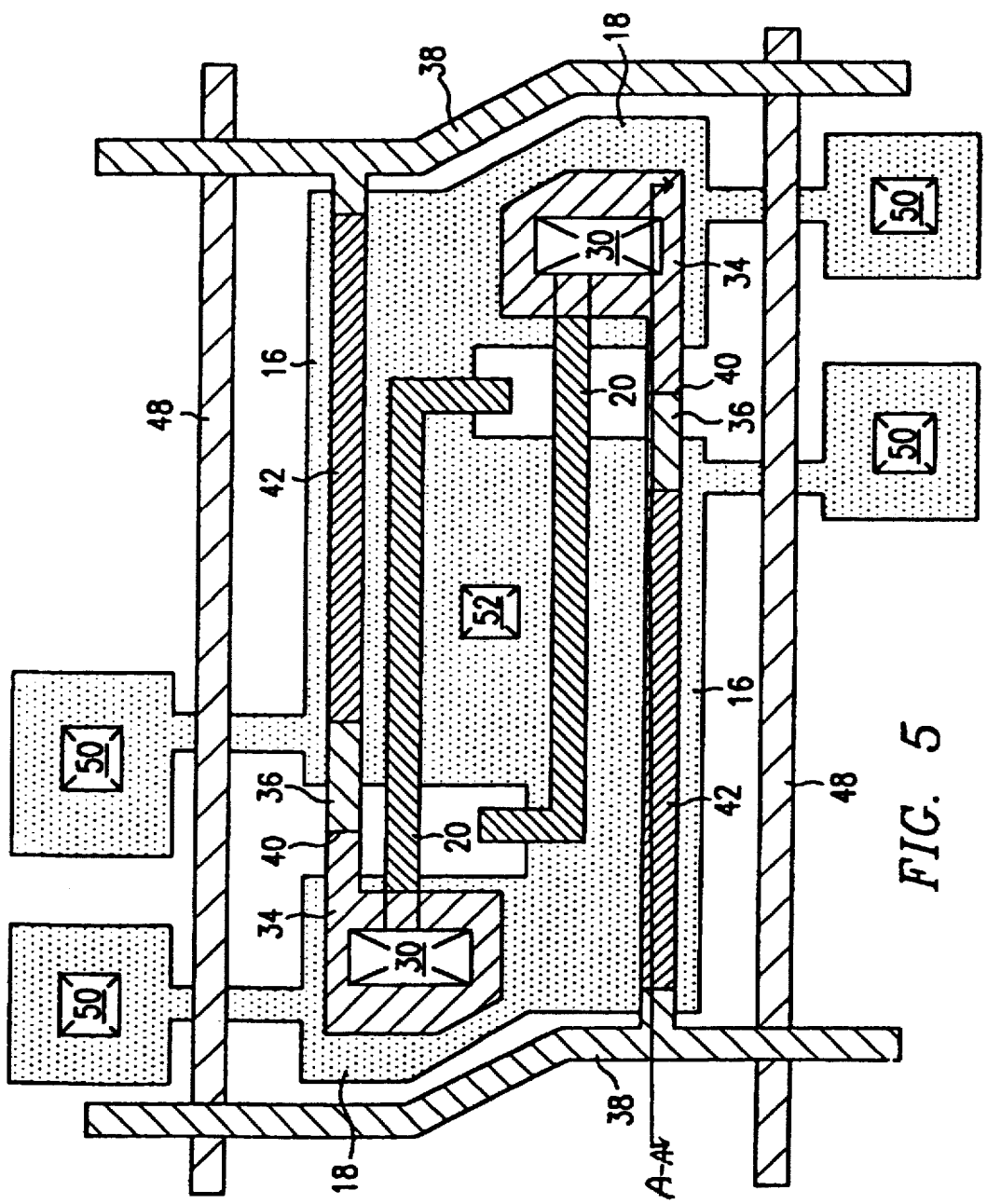
FIG. 5 is a plan view showing the layout of a CMOS SRAM cell utilizing a polycrystalline silicon field effect device as described in the parent application.

Active region 18, although shown as separated into 2 parts, is actually a single active region as will be shown in connection with FIG. 5. Polycrystalline silicon gate line 20 (e.g. 4000 Å thick) is formed over a thin gate oxide layer 22 (e.g. 120 Å thick) as known in the art. Dielectric sidewall spacers 24 are formed using an anisotropic etch as known in the art, causing the formation of lightly doped drain (LDD) regions 26.

Although polycrystalline silicon line 20 appears to function as the gate of a field effect device in the cross sectional view of FIG. 1, it will actually become the location of a shared contact region to be described below. The impurity doping profiles in the region of the polycrystalline silicon line 20 are the same as those for an actual transistor, but this is merely an artifact of the fabrication process as known in the art. Active regions 18 are connected other than in the plane of the cross section of FIG. 1, and direct electrical contact will be made between the polycrystalline silicon signal line 20 and the underlying active region 18 as will be further described below.

To this point, standard fabrication techniques for a CMOS SRAM are used. Variations from the standard process flows will now be performed in order to fabricate a polycrystalline silicon field effect device according to the present invention.

A thin oxide layer 28 is now formed over the surface of the device. In the presently preferred embodiment, this is performed using Plasma Enhanced Chemical Vapor Deposition (PECVD). This allows formation of a good quality oxide layer at relatively low temperatures, between 400° C. and 700° C. (Alternatively a CVD oxide can also be used.) Layer 28 is preferably deposited to a thickness of approximately 500 Å, followed by a densification step performed by heating the device to a temperature of preferably above 850° C. This densification step, in addition to improving the quality of the oxide layer 28, is also preferably used to anneal and activate the $N^+$ and $P^+$ implants in the active areas of the device. The oxide layer 28 will be used as a dielectric for a field effect device, so the quality of oxide layer 28 is important.

Alternatively the oxide layer 28 may be grown, or partially grown and partially deposited. The thickness of the oxide layer may be increased if higher operating voltages are desired.

Referring to FIG. 2, a shared contact region 30 is formed in the oxide layer 28 with a mask and etch step, followed by the deposition of an undoped polycrystalline silicon layer 32 to a depth of e.g. approximately 2000 Å. Various thicknesses may be used; for example, smaller thicknesses (down to 500 Å or so) may be chosen to reduce off-state leakage in low-voltage applications. For another example, larger thicknesses may be used in high-voltage applications, to maximize the drive capability. (The maximum drive capability of an overdriven thin-film transistor is set by the cross-sectional area of the channel, not merely by its width, if the thickness and doping profile are such that the applied gate voltage can modulate conduction through the full channel thickness.) Optionally the second polycrystalline layer 32 can be annealed at this point, to increase its mobility.

A mask is then used to define the shared contact region, and an $N^+$ implant (e.g. $6 \times 10^{15}$ $cm^{-2}$ of As at 30 keV) is made to form region 34. This $N^+$ region within the polycrystalline silicon layer 32 makes good electrical contact with both the active region 18 and the polycrystalline silicon signal line 20. The N⁺ implant area is larger than the actual shared contact region 30 and preferably extends part way onto the field oxide region 12.

Referring to FIG. 3, a P⁺ implant mask is then made, followed by a P⁺ implant step (e.g. $3 \times 10^{15}$ cm⁻² of boron at 20 keV) to form regions 36 and 38. Region 38 forms one source/drain region of the polycrystalline silicon transistor, and the $V_{cc}$ interconnect lines. P⁺ region 36 forms the other source/drain region of the polycrystalline silicon transistor, and also forms a diode at its interface 40 with N⁺ region 34. Preferably, the layout of the photomasks causes the implanted N⁺ and P⁺ regions 34, 36 to overlap slightly, to insure diode formation at the resulting interface 40.

N⁻ channel region 42 is then formed by means of a blanket N⁻ implant (e.g. $3 \times 10^{12}$ cm⁻² of P at 25 keV) over the surface of the device. This implant need not be masked, since its doping level is relatively light compared to that of the N⁺ and P⁺ regions 34, 38, 40. Region 42 forms the conductive channel of the polycrystalline silicon P-channel transistor for which the P⁺ regions 36, 38 are the source and drain.

After all implants have been made into the second polycrystalline silicon layer 32, a masking and etch step is performed to define the polycrystalline silicon transistors, the shared contact regions, and the $V_{cc}$ interconnect lines. It is preferable to make all implants into the second layer of polycrystalline silicon before patterning this layer, so that the polycrystalline silicon layer can be used to protect underlying areas of the device. The order in which the N⁺, P⁺, and N⁻ implants are made is not important. Although these implants have been described above as being performed in the order N⁺, P⁺, N⁻, they could just as easily have been made in the order N⁻, N⁺, P⁺, or any other desired order. As described above, it is not necessary to use a mask for the N⁻ implant.

Note that the threshold voltage of the inverted transistor is an independent parameter, which can be adjusted by the N- implant dose (and by the background doping of the poly, if any). Thus it is possible to select a large $|V_{Tp}|$ for low power operation, or a smaller $|V_{Tp}|$ for faster write speed.

Figure 4:
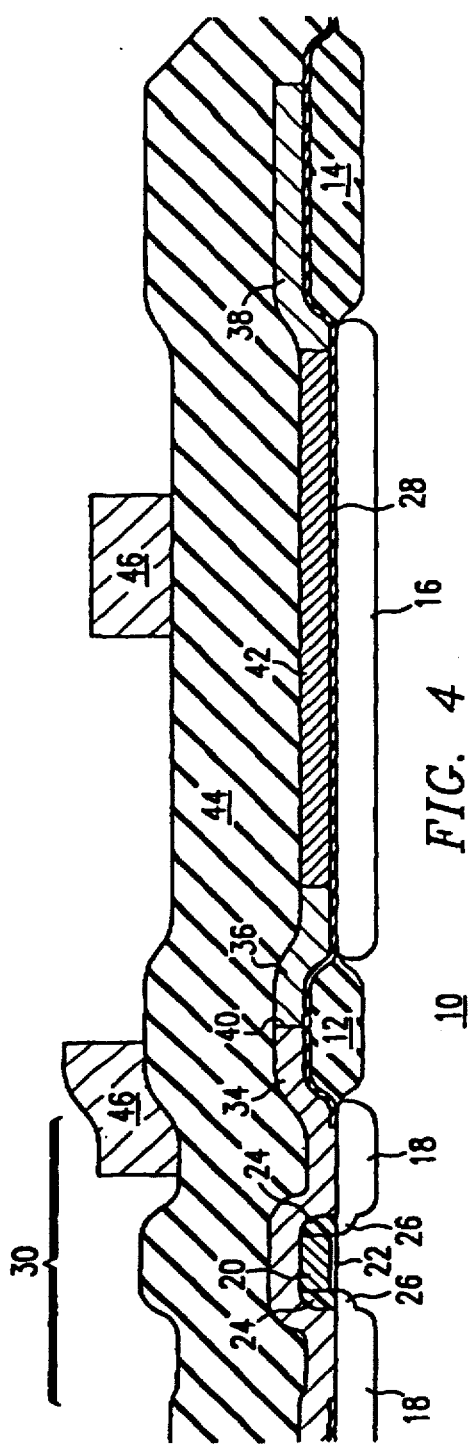

The remainder of the processing steps for the device are conventional. Referring to FIG. 4, once the second layer of polycrystalline silicon has been patterned, a thick oxide layer 44 is then formed over the surface of the chip. Oxide layer 44 is preferably formed from a deposited undoped oxide layer to a thickness of e.g. approximately 2000 Å, and a PSG or BPSG layer to a thickness of e.g. approximately 6000 Å. Insulating layer 44 may then be subjected to reflow in order to smooth its contours prior to metal deposition. (Alternatively, various other techniques may be used may be used for contact formation, e.g. stud contacts or tapered etch processes.) After formation of insulating layer 44 is complete, a metal layer is deposited and patterned to form signal lines 46.

FIG. 5 shows a preferred layout for a CMOS SRAM cell which utilizes the P-channel polycrystalline silicon transistors fabricated as designed above for use as load devices. Further details of such SRAM cell layout are described in the related applications referenced above. In addition to the first level polycrystalline silicon lines 20, word lines 48 are also formed from the first level polycrystalline silicon layer. Contact regions 50 are opened through the overlying insulating layer 44 to make contact with the various metal data signal lines. A metal device ground line makes contact with the SRAM cell through contact region 52.

The cell layout shown in FIG. 5 is an 8-T, dual-port SRAM cell. Each of the polycrystalline silicon lines 48 forms the gate for two N-channel transistors. Each of the signal lines 20 forms the gate for a single N-channel transistor, and the active regions 16 act as gates for the two P-channel polycrystalline silicon devices having channels in regions 42. The P-channel devices are used as load devices between the shared contacts 30 and the $V_{cc}$ signal lines 38.

Figure 6:
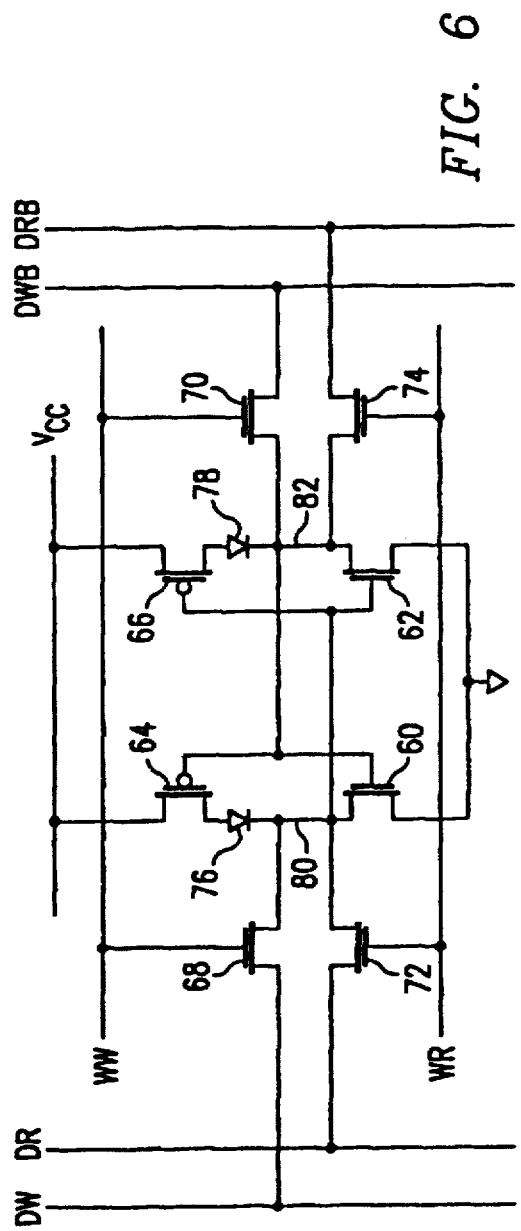
FIG. 6 is a schematic diagram of the SRAM cell of FIG. 5.

A schematic diagram corresponding to the cell layout of FIG. 5 is shown in FIG. 6. N-channel transistors 60, 62 combine with polycrystalline silicon P-channel transistors 64, 66 to form the cross-coupled latch of the cell. N-channel transistors 68 and 70 are connected to the true and complement data write lines (DW) and (DWB) respectively. N-channel transistors 72 and 74 are connected to the true and complement data write signal lines (DR) and (DRB) respectively.

Diodes 76, 78 are those formed by the P-N interfaces 40, and connect to common nodes 80, 82, respectively. The common nodes 80 and 82 correspond to the active region 16 shown in FIGS. 1–4 and act as the gate regions for the P-channel transistors 66, 64.

Transistors 68, 70 are gated by the word write signal line WW, and read transistors 72, 74 are controlled by the word read signal line WR. Lines WW and WR correspond to the polycrystalline word lines 48 shown in FIG. 5. The lines DW, DR, DWB, DRB, and the ground connection are the metal signal lines which make contact to contact regions 50 and 52 of FIG. 5. Operation of the 8-T SRAM cell of FIG. 6 is conventional, and is readily apparent to those skilled in the art.

It will apparent to those skilled in the art that the techniques described above can be used in many different situations. For example, the polycrystalline silicon P-channel loads can be used in single port 6-T cells as well as the dual-port 8-T cells described. Cell layouts other than that shown in FIG. 5 may also be used, and some layouts may make formation of the diodes 76, 78 undesirable or unnecessary. If desired, the gate oxide layer 28 can be grown instead of deposited, although this relatively high temperature step may not be desirable in some process flows. In addition, circuit designs other than SRAM cells may be able to make use of N-channel polycrystalline silicon transistors, and these can be fabricated using the described techniques simply by forming N⁺ source/drain regions and a P⁻ channel.

The CMOS SRAM cell described above has several important advantages over prior art cells. The high value polycrystalline silicon resistor and back-to-back diode load devices limited current flow therethrough to approximately a few picoamps, limiting the overall speed of the device. The use of the polycrystalline silicon P-channel devices allows a load of a few hundred nanoamps to drive switching of the SRAM cell. The quality of the polycrystalline silicon transistors is not high compared to those formed in a monocrystalline silicon substrate, but their performance in an SRAM cell is significantly better than that of the previous high resistance load devices.

Since the P-channel devices provide a high resistance when turned off, and a relatively low resistance when turned on, giving a lower impedance path to the power supply, the SRAM cell is more stable to noise and soft errors such as alpha particle impacts. The cell is faster due to the higher switching current, and works well with lower supply voltages.

The particular layout described in connection with FIG. 5 has the advantage that a relatively long, narrow P-channel device is formed. This gives a high OFF resistance desired for the reasons described above, while also providing a significantly lower ON resistance compared to resistive load devices.

Use of Polycrystalline SiGe Channel

A second embodiment forms the second polycrystalline layer of a silicon/germanium alloy instead of pure silicon. This alloy can have a fairly high germanium content, e.g. 36% germanium, or more generally in the range from 10% to 60% Ge. (Alternatively the germanium concentration can range from about 1% up to concentrations which are predominantly, or even exclusively, composed of germanium.)

An advantage of this innovative embodiment is that the gate oxide is a grown silicon oxide (pure $SiO_2$). SiGe alloys at low Ge concentrations provide grown oxides which are reasonably close in quality to those grown on pure Si; but with higher Ge percentages the characteristics of the grown oxide become more dissimilar. (Indeed the quality of grown silicon oxides was one of the factors which prompted the switch to silicon technologies in the 1960s.) Thus a significant advantage of this innovative embodiment is that the quality of silicon-grown gate oxides can be combined with the advantages of SiGe thin-film transistors.

Another advantage of this innovative embodiment is that the second polycrystalline conductor layer can also be used for local interconnect. Polycrystalline SiGe alloys (especially at concentrations of about 35% or above) have been show to provide better resistivity than heavily doped polysilicon. See e.g. the Noguchi et al. article cited above.

Various known processes can be used for deposition and doping of the SiGe layer. See, e.g., Lin et al. "Effects of $SiH_4$, $GeH_4$, and $B_2H_6$ on the nucleation and deposition of polycrystalline $Si_{1-x}Ge_x$ films," 141 J. ELECTROCHEMICAL SOCIETY 2559 (1994); Lin et al., "Fabrication of p-channel polycrystalline $Si_{1-x}Ge_x$ thin-film transistors by ultrahigh vacuum chemical vapor deposition," 65 APPLIED PHYSICS LETTERS 1700 (1994); King et al., "Deposition and properties of low-pressure chemical-vapor deposited polycrystalline silicon-germanium films," 141 J. ELECTROCHEMICAL SOCIETY 2235 (1994); Caymax et al., "Low temperature selective growth of epitaxial Si and $Si_{1-x}Ge_x$ layers from $SiH_4$ and $GeH_4$ in an ultrahigh vacuum, very low pressure chemical vapour deposition reactor: kinetics and possibilities," 241 THIN SOLID FILMS 324–8 (1994); King et al., "Electrical properties of heavily doped polycrystalline silicon-germanium films," 41 IEEE TRANS'NS ELECTRON DEVICES 228 (1994); Tsutsu et al., "Oxidation of polycrystalline-SiGe alloys," 64 APPLIED PHYSICS LETTERS 297 (1994); and Johnson et al., "Selective chemical etching of polycrystalline SiGe alloys with respect to Si and $SiO_2$," 21 J. ELECTRONIC MATERIALS 805–10 (1992). These articles, and all of the references cited in them, are all hereby incorporated by reference.

Still more information on various details of SiGe processing can be found in the following articles: Verdonckt-Vandebroek et al., "SiGe-channel heterojunction p-MOSFET's," 41 IEEE TRANS'NS ELECTRON DEVICES 90 (1994); Caymax et al., "UHV-VLPCVD heteroepitaxial growth of thin SiGe-layers on Si-substrates: influence of pressure on kinetics and on surface-morphology," 32–33 DIFFUSION AND DEFECT DATA PART B (SOLID STATE PHENOMENA) 361–72 (1993); Hsieh et al., "Ambipolar performances of novel amorphous silicon-germanium alloy thin-film transistors," 32 JAPANESE J. APPLIED PHYSICS PART 2 (Letters) at L1043 (1993); Kesan et al., "High performance 0.25 μm p-MOSFETs with silicon-germanium channels for 300K and 77K operation," 1991 IEDM TECHNICAL DIGEST 25; Verdonckt-Vandebroek et al., "Design issues for SiGe heterojunction FETs," PROC. IEEE/CORNELL CONFERENCE ON ADVANCED CONCEPTS IN HIGH SPEED SEMICONDUCTOR DEVICES AND CIRCUITS 425 (1991); Verdonckt-Vandebroek et al., "High-mobility modulation-doped SiGe-channel p-MOSFETs," 12 IEEE ELECTRON DEVICE LETTERS 447 (1991); Selvakumar et al., "SiGe-channel n-MOSFET by germanium implantation," 12 IEEE ELECTRON DEVICE LETTERS 444–6 (1991); Humlicek et al., "Optical spectra of $Si_xGe_{1-x}$ alloys," 65 J. APPLIED PHYSICS 2827–32 (1989); Prokes et al., "Formation of epitaxial $Si_{1-x}Ge_x$ films produced by wet oxidation of amorphous SiGe layers deposited on Si(100)," 53 APPLIED PHYSICS LETTERS 2483–5 (1988); Hamakawa et al., "Recent advances in amorphous silicon solar cells and their technologies," 59–60 J. NON-CRYSTALLINE SOLIDS 1265 (1983). These articles, and all of the references cited in them, are all hereby incorporated by reference.

Drain Offset

Figure 7:
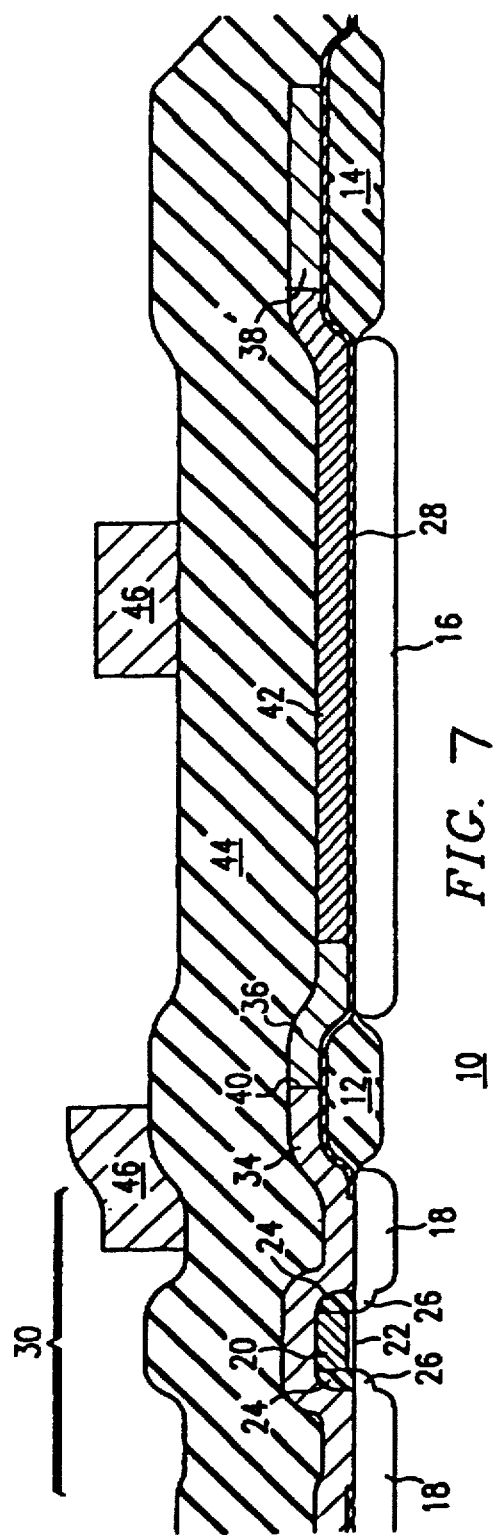
FIG. 7 shows a first alternative embodiment, in which the drain of the polycrystalline semiconductor device is laterally separated from the transistor gate.

FIG. 7 shows a second alternative embodiment, in which the drain of the inverted device is laterally separated from the transistor gate.

An advantage of the substrate-gated polycrystalline-channel transistor is that it easily provides high-voltage withstand capability, since the usual problems of punchthrough, avalanche multiplication, hot carrier generation, junction breakdown, parasitic device turn-on, etc., are all removed or alleviated.

For high-voltage operation, a drain offset is preferably imposed on the inverted transistor. Note that drain region 38', in this embodiment, does not overlie any part of the substrate gate. (Since this transistor does NOT have a self-aligned gate, the source and drain offset are layout choices.) Like an LDD structure, this avoids electric field maxima at the drain boundary, and reduces stress on the gate oxide near the drain edge. However, unlike the LDD structure, the drain offset is patterned, so that the degree of drain offset can be selected, within a single process, to provide the high-voltage capability needed for a particular application.

Power Inverter

Figure 8:
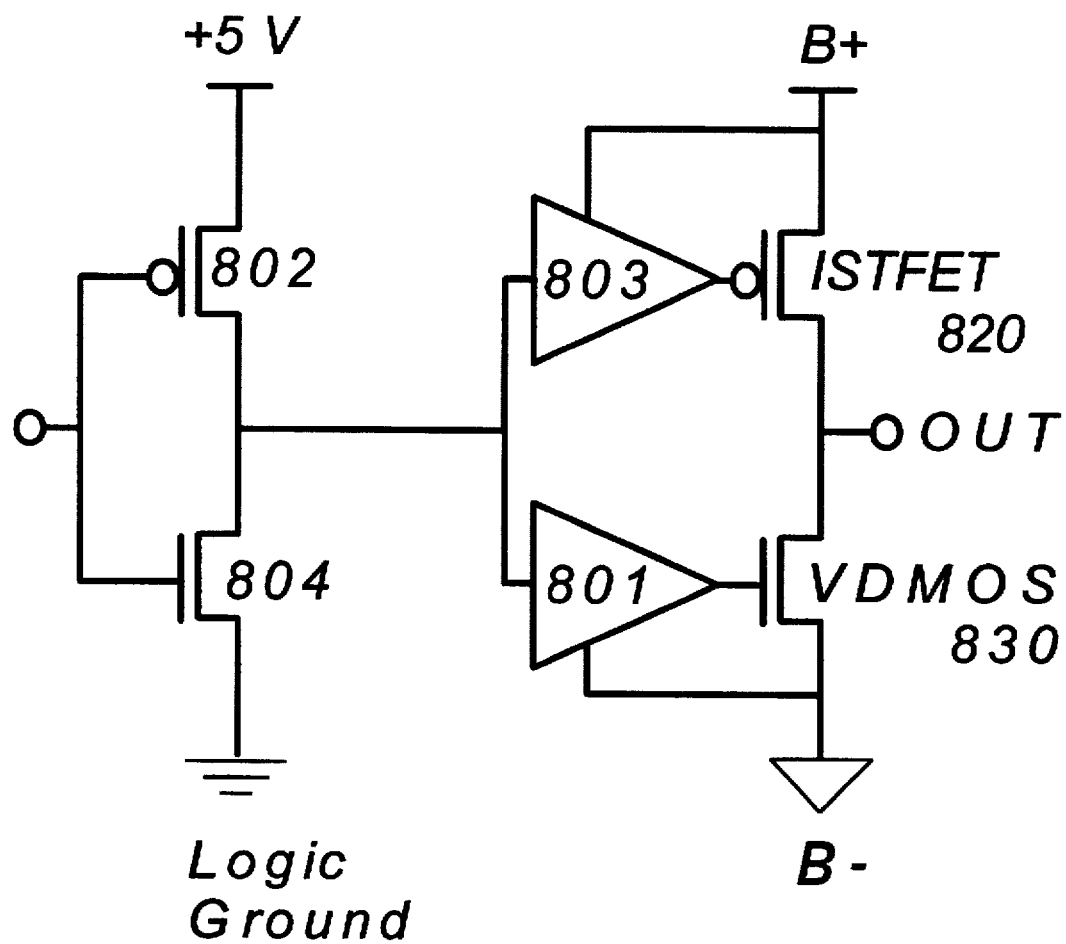
FIG. 8 shows a sample power inverter structure, in which a transistor like that of FIG. 7 is combined with a VDMOS power transistor.

FIG. 8 is a circuit diagram of a sample power inverter structure, in which an inverted transistor 820 like that of FIG. 7 is combined with a VDMOS power transistor.

The inverted transistor 820 requires very little process modification, so it can easily be inserted into an existing smart power process. For some applications where a weak high-voltage pull-up was acceptable, this might be very useful.

In particular, the inverted transistor 820 should be highly resistant to damage from overvoltage spikes, unless the energy in the spike is so high as to cause physical destruction of channel or contact structures.

In the simplified organization which is schematically indicated in FIG. 8, a bulk NMOS transistor 804 and a bulk PMOS transistor 802 provide a CMOS logic gate, which is supplied by normal logic supply voltages, e.g. 0V (logic ground) and 5V. The output of this CMOS gate is level-shifted, in level-shifters 801 and 803, to drive the gates of N-channel VDMOS 830 and inverted P-channel transistor 820 respectively. This provides bipolar drive at the output terminal.

According to a disclosed class of innovative embodiments, there is provided: An integrated circuit, comprising: a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to the channel region through a first gate dielectric layer; a second field-effect transistor, having source and drain diffusions of a second conductivity type located in and defining a channel region therebetween in a second thin-film layer of polycrystalline semiconducting material, and a gate electrode, formed in the monocrystalline body, which is capacitively coupled to the channel region through a second gate dielectric layer; wherein the first and second gate dielectric layers have different thicknesses.

According to another disclosed class of innovative embodiments, there is provided: An integrated circuit, comprising: a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to the channel region through a first gate dielectric layer; a second field-effect transistor, having source and drain diffusions of a second conductivity type located in and defining a channel region therebetween in a second thin-film layer of polycrystalline semiconducting material, and a gate electrode, formed in the monocrystalline body, which is capacitively coupled to the channel region through a second gate dielectric layer; wherein the first and second layers of polycrystalline semiconducting material have different bandgaps.

According to another disclosed class of innovative embodiments, there is provided: An integrated circuit, comprising: a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to the channel region through a first gate dielectric layer; a second field-effect transistor, having source and drain diffusions of a second conductivity type located in and defining a channel region therebetween in a second thin-film layer of polycrystalline semiconducting material, and a gate electrode, formed in the monocrystalline body, which is capacitively coupled to the channel region through a second gate dielectric layer; wherein the drain region of the second transistor does not overly the gate thereof, and the source and drain are asymmetrically located with respect to the gate.

According to another disclosed class of innovative embodiments, there is provided: An integrated circuit, comprising: a first field-effect transistor, having source and drain diffusions of a first conductivity type located in and defining a channel region therebetween in a monocrystalline semiconductor body near a first surface thereof, and a gate electrode, formed in a first thin-film layer of polycrystalline semiconducting material, which is capacitively coupled to the channel region through a first gate dielectric layer; a second field-effect transistor, having source and drain diffusions of a second conductivity type located in and defining a channel region therebetween in a second thin-film layer of polycrystalline semiconducting material, and a gate electrode, formed in the monocrystalline body, which is capacitively coupled to the channel region through a second gate dielectric layer; and a third field-effect transistor, having source diffusions of the first conductivity type located near the first surface of the monocrystalline body, and a gate positioned to control current flow from the source into the monocrystalline body away from the first surface thereof; and a fourth transistor, having source and drain diffusions of the second conductivity type located in the monocrystalline body; the second and third transistors being connected to define a high-voltage driver stage, and the first and fourth transistors being connected to define a low-voltage inverter which is operatively connected to drive the gate terminals of the second and third transistors.

According to another disclosed class of innovative embodiments, there is provided: An integrated circuit fabrication method, comprising the steps of: providing a substrate which includes substantially monolithic semiconductor material; growing a first gate dielectric on at least part of the semiconductor material; forming a first patterned conductive polycrystalline thin-film layer which defines transistor gates, insulated by the first gate dielectric, over at least some portions of the semiconductor material; stripping the first gate dielectric from at least some areas of the semiconductor material, and forming a second gate dielectric thereon, and forming patterned diffusions in the semiconductor material to define first sources and first drains; and forming a second patterned conductive polycrystalline thin-film layer which defines thin-film transistor channels, insulated by the second gate dielectric, over at least some portions of the semiconductor material, and forming patterned diffusions in the second layer to define second sources and second drains; whereby the first and second gate dielectrics can be independently optimized for different transistor characteristics.

According to another disclosed class of innovative embodiments, there is provided: An integrated circuit fabrication method, comprising the steps of: providing a substrate which includes substantially monolithic semiconductor material; growing a first gate dielectric on at least part of the semiconductor material; forming a first patterned conductive polycrystalline thin-film layer which defines transistor gates, insulated by the first gate dielectric, over at least some portions of the semiconductor material; stripping the first gate dielectric from at least some areas of the semiconductor material, and forming a second gate dielectric thereon, and forming patterned diffusions in the semiconductor material to define first sources and first drains; and forming a second patterned conductive polycrystalline thin-film layer which defines thin-film transistor channels, insulated by the second gate dielectric, over at least some portions of the semiconductor material, and forming patterned diffusions in the second layer to define second sources and second drains; wherein the second drains are laterally spaced from surface portions of the semiconductor material; whereby the first and second gate dielectrics can be independently optimized for different transistor characteristics.

According to another disclosed class of innovative embodiments, there is provided: An integrated circuit fabrication method, comprising the steps of: providing a substrate which includes substantially monolithic semiconductor material; growing a first gate dielectric on at least part of the semiconductor material; forming a first patterned conductive polycrystalline thin-film layer which defines transistor gates, insulated by the first gate dielectric, over at least some portions of the semiconductor material; stripping the first gate dielectric from at least some areas of the semiconductor material, and forming a second gate dielectric thereon, and forming patterned diffusions in the semiconductor material to define first sources and first drains; and forming a second patterned conductive polycrystalline thin-film layer which defines thin-film transistor channels, insulated by the second gate dielectric, over at least some portions of the semiconductor material, and forming patterned diffusions in the second layer to define second sources and second drains; wherein the first and second polycrystalline layers have different semiconductor compositions; whereby the first and second gate dielectrics can be independently optimized for different transistor characteristics.

Modifications and Variations

The disclosed inventions can be modified and varied in a wide variety of ways.

For example, the polycrystalline layer which provides the transistor channel can be deposited as amorphous material, and will thereafter acquire some grain structure from subsequent steps at elevated temperature. (Steps above about 600° C. will cause amorphous to convert to poly.) Alternatively, in a low-temperature process, it might even be possible to use amorphous rather than polycrystalline material for the transistor channel, but this is less preferred.

For another example, the pull-down transistor in the power inverter of FIG. 8 can instead be, e.g., an IGBT, a lateral DMOS device, or a bipolar transistor.

Note that the inverted transistor is not useful only for SRAM cells. In general, it provides a latchup-proof and SEU-resistant CMOS logic architecture. In some embodiments it may be useful to use the inverted transistors in the peripheral circuits of a memory also. This device architecture may also be useful in the I/O circuitry of random logic; for example, an inverted PMOS device can be useful to provide the weak pull-up on an Intel-type microcontroller I/O port pin.

The inverted transistors can also be used advantageously in EEPROMs, EPROMs, and flash memories for switching the high voltage supply ($V_{PP}$).

In portions of the chip where the inverted transistors are not needed, the N+ or P+ portions of the second polycrystalline conductor layer can simply be used for an interconnect.

The source and drain dopings of the inverted transistor can also be made according to the teachings of U.S. Pat. No. 5,344,790 (which is hereby incorporated by reference), e.g. with asymmetrical source and drain doping profiles of which one includes a combination of a faster-diffusing dopant with a slower-diffusing dopant.

Doping operates slightly differently in polycrystalline semiconductor materials, and the relevant channel doping level is the effective doping. See, e.g., POLYCRYSTALLINE SEMICONDUCTORS (ed. G. Harbeke 1985); and T. Kamins, POLYCRYSTALLINE SILICON FOR INTEGRATED CIRCUIT APPLICATIONS (1988); both of which are hereby incorporated by reference.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:

a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to said channel region through a first gate dielectric layer;

a second field-effect transistor, having source and drain diffusions of a second conductivity type located in and defining a channel region therebetween in a second thin-film layer of polycrystalline semiconducting material, and a gate electrode, formed in said monocrystalline body, which is capacitively coupled to said channel region through a second gate dielectric layer;

wherein said first and second gate dielectric layers have different thicknesses at all locations.

2. The integrated circuit of claim 1, wherein said first and second gate dielectrics have different effective thicknesses.

3. An integrated circuit, comprising:

a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to said channel region through a first gate dielectric layer;

a second field-effect transistor, having source and drain diffusions of a second conductivity type located in and defining a channel region therebetween in a second thin-film layer of polycrystalline semiconducting material, and a gate electrode, formed in said monocrystalline body, which is capacitively coupled to said channel region through a second gate dielectric layer;

wherein said first and second gate dielectric layers have different thicknesses; and wherein said second polycrystalline film, but not said first polycrystalline film, has a total thickness which is less than 1000 Å.

4. An integrated circuit, comprising:

a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to said channel region through a first gate dielectric layer;

a second field-effect transistor, having source and drain diffusions of a second conductivity type located in and defining a channel region therebetween in a second thin-film layer of polycrystalline semiconducting material, and a gate electrode, formed in said monocrystalline body, which is capacitively coupled to said channel region through a second gate dielectric layer;

wherein said first and second gate dielectric layers have different thicknesses; and wherein said second polycrystalline film has a total thickness which is less than two-thirds that of said first polycrystalline film.

5. The integrated circuit of claim 1, wherein said first polycrystalline film consists essentially of polysilicon.

6. An integrated circuit, comprising:

a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to said channel region through a first gate dielectric layer;

a second field-effect transistor, having source and drain diffusions of a second conductivity type located in and defining a channel region therebetween in a second thin-film layer of polycrystalline semiconducting material, and a gate electrode, formed in said monocrystalline body, which is capacitively coupled to said channel region through a second gate dielectric layer;

where in said first and second gate dielectric layers have different thicknesses; and wherein said first and second polycrystalline films have different thicknesses.

7. An integrated circuit, comprising:

a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to said channel region through a first gate dielectric layer;

a second field-effect transistor, having source and drain diffusions of a second conductivity type located in and defining a channel region therebetween in a second thin-film layer of polycrystalline semiconducting material, and a gate electrode, formed in said monocrystalline body, which is capacitively coupled to said channel region through a second gate dielectric layer;

wherein said first and second gate dielectric layers have different thicknesses; and wherein said first and second field-effect transistors are interconnected to provide a CMOS logic gate.

8. The integrated circuit of claim 1, wherein said first field-effect transistor and said second field-effect transistor provide a latch.

9. An integrated circuit, comprising:

a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to said channel region through a first gate dielectric layer;

a second field-effect transistor, having source and drain diffusions of a second conductivity type located in and defining a channel region therebetween in a second thin-film layer of polycrystalline semiconducting material, and a gate electrode, formed in said monocrystalline body, which is capacitively coupled to said channel region through a second gate dielectric layer, wherein said first and second gate dielectrics have different effective thicknesses;

wherein said drain region of said second transistor does not overlie said gate thereof, and said source and drain are asymmetrically located with respect to said gate.

10. An integrated circuit, comprising:

a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to said channel region through a first gate dielectric layer;

a second field-effect transistor, having source and drain diffusions of a second conductivity type located in and defining a channel region therebetween in a second thin-film layer of polycrystalline semiconducting material, and a gate electrode, formed in said monocrystalline body, which is capacitively coupled to said channel region through a second gate dielectric layer, wherein said second polycrystalline film, but not said first polycrystalline film, has a total thickness which is less than 1000 Å;

wherein said drain region of said second transistor does not overlie said gate thereof, and said source and drain are asymmetrically located with respect to said gate.

11. An integrated circuit, comprising:

a first field-effect transistor, having source and drain diffusions of a first conductivity type located in and defining a channel region therebetween in a monocrystalline semiconductor body, and a gate electrode, formed in a first thin-film layer of polycrystalline semiconducting material, which is capacitively coupled to said channel region through a first gate dielectric layer;

a second field-effect transistor, having source and drain diffusions of a second conductivity type located in and defining a channel region therebetween in a second thin-film layer of polycrystalline semiconducting material, and a gate electrode, formed in said monocrystalline body, which is capacitively coupled to said channel region through a second gate dielectric layer, wherein said second polycrystalline film has a total thickness which is less than two-thirds that of said first polycrystalline film;

wherein said drain region of said second transistor does not overlie said gate thereof, and said source and drain are asymmetrically located with respect to said gate.

12. An integrated circuit, comprising:

a first field-effect transistor, having source and drain diffusions of a first conductivity type located in and defining a channel region therebetween in a monocrystalline semiconductor body; and a gate electrode, formed in a first thin-film layer of polycrystalline semiconducting material, which is capacitively coupled to said channel region through a first gate dielectric layer;

a second field-effect transistor, having source and drain diffusions of a second conductivity type located in and defining a channel region therebetween in a second thin-film layer of polycrystalline semiconducting material, and a gate electrode, formed in said monocrystalline body, which is capacitively coupled to said channel region through a second gate dielectric layer, wherein said first and second polycrystalline films have different thicknesses;

wherein said drain region of said second transistor does not overlie said gate thereof, and said source and drain are asymmetrically located with respect to said gate.

13. An integrated circuit, comprising:

a first field-effect transistor, having source and drain diffusions of a first conductivity type located in and defining a channel region therebetween in a monocrystalline semiconductor body near a first surface thereof, and a gate electrode, formed in a first thin-film layer of polycrystalline semiconducting material, which is capacitively coupled to said channel region through a first gate dielectric layer;

a second field-effect transistor, having source and drain diffusions of a second conductivity type located in and defining a channel region therebetween in a second thin-film layer of polycrystalline semiconducting material, and a gate electrode, formed in said monocrystalline body, which is capacitively coupled to said channel region through a second gate dielectric layer; and a third field-effect transistor, having source diffusions of said first conductivity type located near said first surface of said monocrystalline body, and a gate positioned to control current flow from said source into said monocrystalline body away from said first surface thereof; and a fourth transistor, having source and drain diffusions of said second conductivity type located in said monocrystalline body;

said second and third transistors being connected to define a high-voltage driver stage, and said first and fourth transistors being connected to define a low-voltage inverter which is operatively connected to drive said gate terminals of said second and third transistors.

14. The integrated circuit of claim 13, wherein said third transistor is a DMOS transistor.

15. The integrated circuit of claim 13, wherein said first and second gate dielectrics have different effective thicknesses.

16. The integrated circuit of claim 13, wherein said second polycrystalline film, but not said first polycrystalline film, comprises at least 10% germanium.

17. The integrated circuit of claim 13, wherein said second polycrystalline film, but not said first polycrystalline film, has a total thickness which is less than 1000 Å.

18. The integrated circuit of claim 13, wherein said second polycrystalline film has a total thickness which is less than two-thirds that of said first polycrystalline film.

19. The integrated circuit of claim 13, wherein said first polycrystalline film consists essentially of polysilicon.

20. The integrated circuit of claim 13, wherein said first and second polycrystalline films have different thicknesses.

21. The integrated circuit of claim 14, wherein said first field-effect transistor and said second field-effect transistor to provide a latch.

22. The integrated circuit of claim 13, wherein said second polycrystalline film comprises at least about 10% at of a semiconductor other than silicon, and said second gate dielectric is more than 99% at silicon dioxide.

* * * * *